United States Patent [19]

Ogihara et al.

[11] Patent Number: 5,700,714
[45] Date of Patent: Dec. 23, 1997

[54] DIFFUSION MASK AND FABRICATION METHOD FOR FORMING PN-JUNCTION ELEMENTS IN A COMPOUND SEMICONDUCTOR SUBSTRATE

[75] Inventors: Mitsuhiko Ogihara; Yukio Nakamura; Masumi Koizumi; Masumi Taninaka, all of Tokyo, Japan

[73] Assignee: Oki Electric Industry Co., Ltd., Tokyo, Japan

[21] Appl. No.: 588,890

[22] Filed: Jan. 19, 1996

[30] Foreign Application Priority Data

Jan. 19, 1995 [JP] Japan ................... 7-006139

[51] Int. Cl.⁶ .................................................. H01L 21/38
[52] U.S. Cl. ............................ 437/167; 437/160; 437/234
[58] Field of Search ............................ 437/167, 168, 437/160, 161, 234; 148/DIG. 65

[56] References Cited

U.S. PATENT DOCUMENTS

| | | | |
|---|---|---|---|
| 3,907,616 | 9/1975 | Weimer | 437/164 |
| 3,909,119 | 9/1975 | Wollery | 148/DIG. 85 |
| 4,058,413 | 11/1977 | Welch et al. | 148/DIG. 65 |
| 4,149,307 | 4/1979 | Henderson | 437/187 |
| 4,320,410 | 3/1982 | Nishizawa et al. | 257/264 |
| 4,506,281 | 3/1985 | Nishizawa et al. | 257/264 |
| 4,642,879 | 2/1987 | Kawata et al. | 148/DIG. 84 |
| 5,523,590 | 6/1996 | Ogihara et al. | 257/88 |
| 5,530,268 | 6/1996 | Ogihara et al. | 257/88 |

FOREIGN PATENT DOCUMENTS

| | | |
|---|---|---|
| 62-16573 | 1/1987 | Japan . |
| 98721/1987 | 5/1987 | Japan . |
| 139320/1987 | 6/1987 | Japan . |
| 07321371 | 12/1995 | Japan . |

*Primary Examiner*—Michael Trinh
*Attorney, Agent, or Firm*—Spencer & Frank

[57] ABSTRACT

A pn-junction element is formed in a compound semiconductor substrate by depositing an aluminum-nitride film on the surface of the substrate, patterning the aluminum-nitride film to form a diffusion mask, depositing a diffusion source film on the diffusion mask, diffusing an impurity from the diffusion source film into the substrate, and removing the diffusion source film with buffered hydrofluoric acid. Electrode lines can then be formed directly on the aluminum-nitride diffusion mask, which is not etched by buffered hydrofluoric acid.

20 Claims, 3 Drawing Sheets

5,700,714

DIFFUSION MASK AND FABRICATION METHOD FOR FORMING PN-JUNCTION ELEMENTS IN A COMPOUND SEMICONDUCTOR SUBSTRATE

BACKGROUND OF THE INVENTION

The present invention relates to a diffusion mask and fabrication method for forming pn-junction elements in a compound semiconductor substrate.

Light-emitting diodes are one common example of a pn-junction element formed in a compound semiconductor substrate. These elements are often formed by diffusing zinc through windows in a diffusion mask into a III–V compound semiconductor (e.g. gallium-arsenide) substrate. Diffusion masks of aluminum oxide ($Al_2O_3$, also referred to as alumina) or silicon nitride have often been employed.

One known diffusion method sputters a zinc-doped oxide film onto the diffusion mask, sputters a silicon-dioxide cap onto the zinc-doped oxide film, and then applies heat to diffuse zinc from the zinc-doped oxide film through windows in the diffusion mask into the substrate. To avoid thermal strain, this method preferably employs a diffusion mask having a coefficient of thermal expansion matching that of the substrate. For a gallium-arsenide substrate, such diffusion masks are obtained by mixing aluminum oxide in a suitable ratio with silicon dioxide ($SiO_2$), silicon nitride ($Si_3N_4$), or aluminum nitride (AlN).

After diffusion, the zinc-doped oxide is removed by etching with hydrofluoric acid (HF) buffered with ammonium fluoride ($NH_4F$). The etch can be stopped before the underlying diffusion mask is removed, leaving the diffusion mask to serve as an insulating film, on which a metal film is deposited and patterned to provide electrical interconnections to the diffusion regions in the substrate. These diffusion regions are exposed at the windows in the diffusion mask, so the insulation is self-aligned, and no separate photolithography step is required to form the insulation pattern. Having the diffusion mask double as a self-aligned insulating film simplifies the fabrication process and reduces the manufacturer's costs.

When a diffusion mask comprising aluminum oxide is left as an insulating film, however, problems such as current leakage and short circuits have been found to occur in the completed devices. The reason for these problems is that aluminum oxide is itself etched by buffered HF, so that even if the etch is stopped without removing the diffusion mask, etching may widen the windows in the diffusion mask to the extent that portions of the substrate outside the diffusion regions are exposed. Etching may also create new holes in the diffusion mask. e.g. below pinholes in tile zinc-doped oxide.

Similar problems occur, for the same reasons, when silicon-nitride diffusion masks, or diffusion masks comprising aluminum oxide mixed with other materials as noted above, are employed as insulating films.

One way to avoid these problems is to etch the zinc-doped oxide only over the windows in the diffusion mask, and not over the diffusion mask material itself. This requires an additional photolithography step to create an etching mask, however, and introduces the problem of alignment between the etching mask and the diffusion mask. The benefits of a simplified fabrication process and reduced cost are therefore lost.

Another possible approach would be to cover the diffusion mask with an additional insulating film, after the zinc-doped oxide had been removed, but that would also require an additional photolithography step, to pattern the additional insulating film. Once again, the benefits of a simplified process and reduced cost would be lost, and the problem of alignment error would occur.

SUMMARY OF THE INVENTION

It is accordingly an object of the present invention to provide a diffusion mask that can be reliably employed as a self-aligned insulating film.

Another object of the invention is to avoid etching damage to the diffusion mask when overlying layers are etched, without employing an etching mask.

A further object is to provide an efficient method of fabricating pn-junction elements in a compound semiconductor substrate, while insulating the surface of the substrate in a manner that avoids current leakage and short circuits.

The invented diffusion mask comprises an aluminum-nitride film. Aluminum nitride is not etched by HF.

The invented diffusion method comprises the steps of:

depositing an aluminum-nitride film on the surface of a compound semiconductor substrate;

patterning the aluminum-nitride film to form a diffusion mask;

depositing a diffusion source film on the diffusion mask;

diffusing an impurity from the diffusion source film into the compound semiconductor substrate; and removing the diffusion source film by etching with HF.

The invented diffusion method preferably also comprises the steps of:

depositing an anneal cap on the diffusion source film, prior to diffusion; and removing the anneal cap after diffusion.

DETAILED DESCRIPTION OF THE PREFERRED EMBODIMENTS

Figure 1:
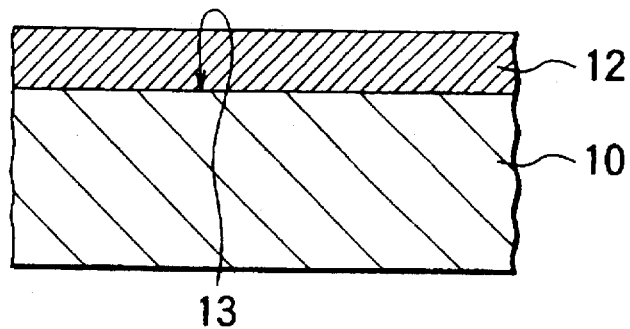
FIG. 1 is a sectional view of part of a compound semiconductor wafer, illustrating a first step in the invented fabrication method.

Embodiments of the invented mask and method will be described below with reference to the drawings. The drawings are schematic, and do not attempt to depict actual shapes or dimensions or illustrate every detail of the invented fabrication method. The invention is accordingly not limited to what is shown in the drawings.

The description that follows pertains to a fabrication method for an array of light-emitting diodes, but the drawings will show only one diode in the array.

Referring to FIG. 1, the fabrication process starts from a III-V compound semiconductor substrate, for example, an n-type gallium-arsenide-phosphide compound semiconductor substrate 10 such as a $GaAs_{0.8}P_{0.2}$ wafer. In the subsequent description, following customary usage, the word wafer will denote the substrate 10 together with various films deposited on the substrate.

In the first step of the process, an aluminum-nitride (AlN) film 12 is deposited on the entire upper surface 13 of the compound semiconductor substrate 10. An aluminum-nitride film 12 with a c-axis crystal orientation can be deposited by a reactive sputtering method, using an aluminum target, with nitrogen ($N_2$) as the sputtering gas. Alternatively, a mixture of nitrogen and argon (Ar) can be used as the sputtering gas. Either dc or rf sputtering may be employed as the reactive sputtering method.

Figure 2:
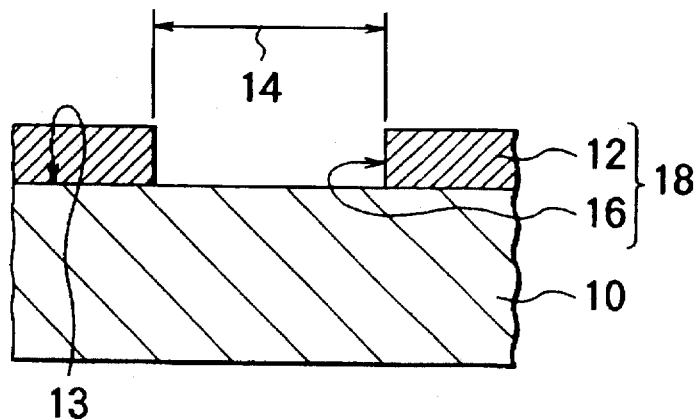
FIG. 2 illustrates a second step in the invented fabrication method.

Referring to FIG. 2, in the next step the aluminum-nitride film 12 is patterned by well-known photolithography techniques to define regions 14 into which an impurity will be diffused. The aluminum-nitride film 12 is removed from these regions 14 by wet etching with hot phosphoric acid, leaving diffusion windows 16 that expose the surface 13 of the substrate 10. With the formation of these diffusion windows 16, the aluminum-nitride film 12 becomes a diffusion mask 18.

Figure 3:
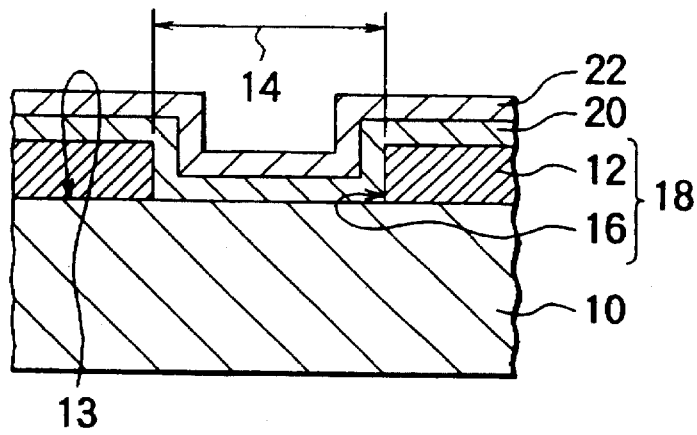
FIG. 3 illustrates a third step in the invented fabrication method.

Referring to FIG. 3, in the next step a diffusion source film 20 and a first anneal cap 22 are formed sequentially on the diffusion mask 18, covering both the aluminum-nitride film 12 and diffusion windows 16.

The diffusion source film 20 may comprise any substance that includes the impurity to be diffused and can be etched by buffered HF. Here the impurity is zinc and the diffusion source film 20 is a zinc-doped oxide film comprising zinc oxide mixed with silicon dioxide ($ZnO/SiO_2$). A diffusion source film consisting entirely of zinc oxide (ZnO) could also be used.

The first anneal cap 22 must consist of a substance that blocks the passage of the impurity (which here is zinc), so that the impurity will diffuse into the substrate 10 and not escape into ambient space inside the diffusion chamber. This property is essential for achieving a high diffusion concentration under favorable diffusion conditions. Another desirable property of the first anneal cap 22 is that it block the passage of atoms of the compound semiconductor substrate 10, in this case atoms of gallium (Ga), arsenic (As), and phosphorus (P), because the escape of these atoms leads to substrate defects. Aluminum nitride has both of these properties, so here the first anneal cap film 22 is an aluminum-nitride film.

The diffusion source film 20 and anneal cap 22 are formed in a continuous sputtering operation by placing the wafer in a sputtering chamber containing both a $ZnO/SiO_2$ target and an aluminum target. The two targets are disposed behind separate shutters. To deposit the diffusion source film 20, the shutter of the $ZnO/SiO_2$ target is opened, the shutter of the aluminum target is closed, and $ZnO/SiO_2$ is sputtered onto the wafer, using a mixture of argon and oxygen ($O_2$) as the sputtering gas. When the desired film thickness has been attained, the shutter of the $ZnO/SiO_2$ target is closed and the sputtering gas is replaced with a mixture of argon and nitrogen. Then the shutter of the aluminum target is opened and the aluminum-nitride anneal cap 22 is deposited by reactive sputtering.

Continuous sputtering has the advantage of saving labor, but the invention can of course be practiced with separate sputtering steps for the diffusion source film 20 and anneal cap 22, these separate steps being carried out in different sputtering chambers.

The invention can also be practiced with other anneal cap materials, including nitride films such as silicon nitride, or oxide films such as $SiO_2$ or $Al_2O_3$. In principle, any film that blocks diffusion of the impurity can be used. A $ZnO/SiO_2$ diffusion source film and an $SiO_2$ anneal cap can be formed in a continuous operation by the same procedure as described above, except that the second target consists of $SiO_2$ instead of aluminum, the second sputtering gas is argon, and the second sputtering operation is not reactive.

Figure 4:
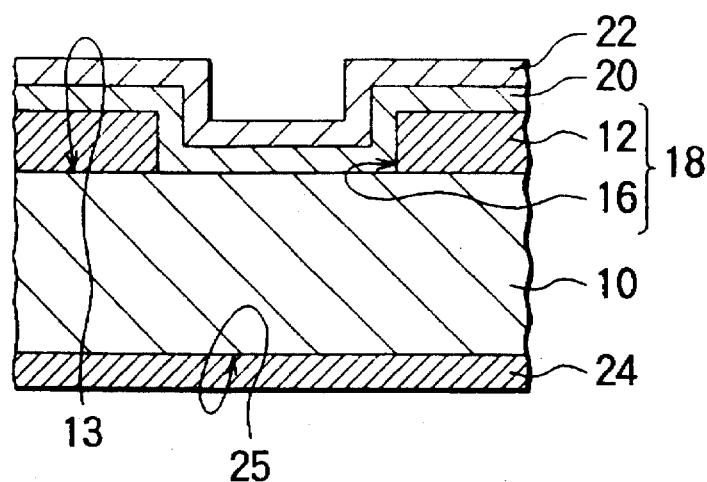
FIG. 4 illustrates a fourth step in the invented fabrication method.

Referring now to FIG. 4, in the next step a second anneal cap 24 is formed on the bottom surface 25 of the compound semiconductor substrate 10. The purpose of the second anneal cap 24 is to prevent the escape of constituent elements of the compound semiconductor substrate 10 during diffusion, so the second anneal cap 24 may consist of any material that blocks the passage of these elements. Here the second anneal cap 24 is another aluminum-nitride film.

The invention can be practiced without forming a second anneal cap 24. If, for example, the bottom surface 25 is polished afterwards, prior to deposition of an electrode layer as described below, then the second anneal cap 24 does not necessarily have to be formed.

Figure 5:
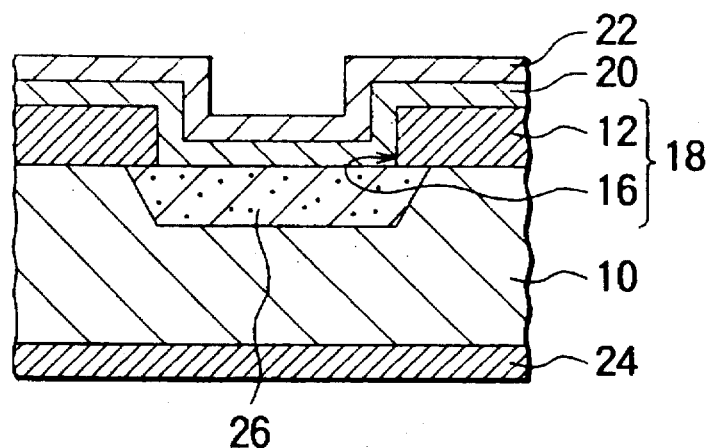
FIG. 5 illustrates a fifth step in the invented fabrication method.

Referring to FIG. 5, in the next step the wafer is annealed (heated), causing zinc to diffuse from the diffusion source film 20 through the diffusion windows 16 and into the compound semiconductor substrate 10, forming p-type diffusion regions 26. A pn junction is created at the boundary between each p-type diffusion region 26 and the n-type compound semiconductor substrate 10. The junction depth can be controlled by controlling the annealing temperature and annealing time.

Figure 6:
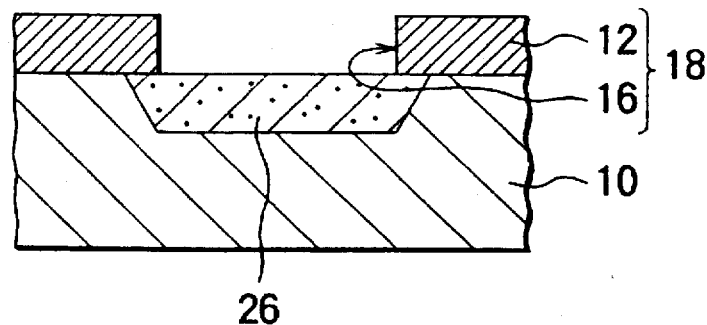
FIG. 6 illustrates a sixth step in the invented fabrication method.

Referring to FIG. 6, in the next step, first the anneal caps 22 and 24 are removed by wet etching with hot phosphoric acid, then the diffusion source film 20 is removed by wet etching with HF or buffered HF. These etching processes are performed on the entire wafer surface, with no etching mask and no photolithography step. Nevertheless, since HF and buffered HF do not etch aluminum nitride, the diffusion mask 18 is left substantially intact. The diffusion windows 16 are not widened, and no new holes are opened in the diffusion mask 18, even if pinholes were present in the diffusion source film 20.

The etchant employed for removing the anneal caps 22 and 24 can be varied as required according to the composition of the anneal caps. In particular, if silicon nitride is employed for the anneal caps 22 and 24, then the anneal caps 22 and 24 and diffusion source film 20 can all be removed in a single wet etching step, using HF or buffered HF as the etchant, thereby simplifying the fabrication process.

Figure 7:
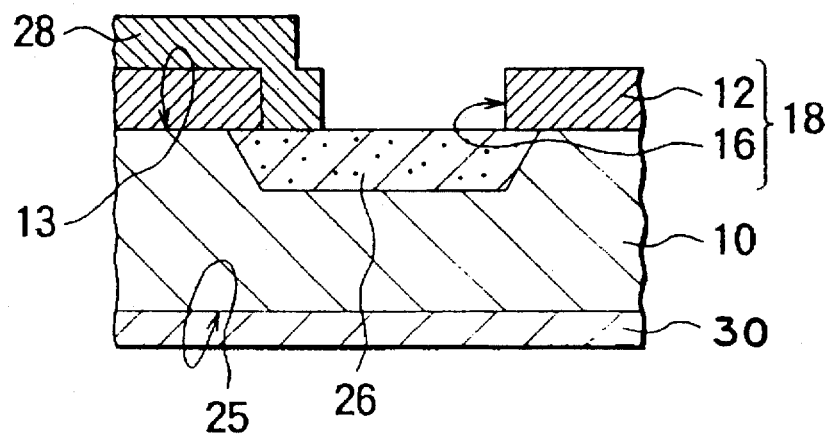
FIG. 7 illustrates a seventh step in the invented fabrication method.

Referring to FIG. 7, in the next step an aluminum (Al) film is deposited on the upper surface of the wafer and patterned to form a set of electrode lines 28. One electrode line 28 makes contact with each p-type diffusion region 26 through the corresponding diffusion window 16. An ohmic contact is created between the electrode lines 28 and impurity diffusion regions 26 by sintering.

Next, a gold alloy film is deposited on the bottom surface 25 of the wafer as an electrode film 30, and is sintered to create an ohmic contact with the compound semiconductor substrate 10. This completes the process of light-emitting-diode formation. When current is fed from the electrode film 30 to an electrode line 28, light will be emitted from the pn junction between the corresponding p-type diffusion region 26 and the n-type substrate 10.

As can be seen from the drawings, the diffusion regions 26 are somewhat wider than the diffusion windows 16, due to lateral diffusion of the zinc impurity. Since the diffusion windows 16 are not widened during the wet etching step that removes the diffusion source film 20, the electrode lines 28 make contact only with the p-type diffusion regions 26, and not with the surrounding n-type substrate 10. Similarly, since no new holes are opened in the diffusion mask 18, no short circuits are created through the aluminum-nitride film 12 between the electrode lines 28 and compound semiconductor substrate 10. All current is therefore constrained to flow through the pn junction between the substrate 10 and diffusion region 26, as desired.

As the invented diffusion mask 18 itself provides reliable insulation between the electrode lines 28 and compound semiconductor substrate 10, no additional insulating film is required. The insulation thus provided is moreover self-aligned with the diffusion regions, and does not require a separate photolithography step, so the fabrication process is simple and low in cost.

As stated earlier, the invented fabrication method is not restricted to the embodiment described above. Some possible variations in the composition of the diffusion source film and anneal caps have already been pointed out. As a further variation, impurities other than zinc can be employed. These include n-type impurities, which may be diffused into a p-type compound semiconductor substrate, instead of diffusing a p-type impurity into an n-type substrate, to form pn junctions.

The compound semiconductor substrate need not be GaAsP; other compound semiconductors (other III-V compound semiconductors, for example) can be employed. When GaAsP is employed, moreover, the composition ratio need not be $GaAs_{0.8}P_{0.2}$. In general it may be $GaAs_{1-x}P_x$, where x has any desired value. $GaAs_{0.8}P_{0.2}$ has the advantage, however, of a coefficient of thermal expansion closely matching that of aluminum oxide.

The aluminum-nitride film used as the diffusion mask was described as having a c-axis orientation, but this is not a restriction. Other crystal orientations are also possible.

It is not necessary for all of the films described above to be formed by sputtering. Other deposition processes are possible, although sputtering has the advantage of being carried out at a comparatively low temperature.

It is expected that the invented fabrication method will prove useful for fabricating various types of devices, not just arrays of light-emitting diodes.

Those skilled in the art will recognize that still further variations are possible within the scope claimed below.

What is claimed is:

1. A method of fabricating a pn-junction element in a compound semiconductor substrate, comprising the steps of:

forming an aluminum-nitride film on said compound semiconductor substrate;

patterning said aluminum-nitride film to create a diffusion mask with windows;

forming a diffusion source film comprising an impurity on said diffusion mask and windows;

diffusing said impurity from said diffusion source film into said compound semiconductor substrate through said windows by annealing; and removing said diffusion source film entirely from said diffusion mask and windows, by etching with hydrofluoric acid.

2. The method of claim 1, comprising the further steps of:

forming an anneal cap on said diffusion source film before said step of diffusing; and removing said anneal cap by etching, after said step of diffusing.

3. The method of claim 2, wherein said anneal cap comprises aluminum nitride.

4. The method of claim 1, comprising the further step of forming electrode lines on said diffusion mask after said diffusion source film has been removed.

5. The method of claim 1, wherein said diffusion source film comprises zinc as said impurity.

6. The method of claim 5, wherein said diffusion source film comprises a zinc-doped oxide.

7. The method of claim 1, wherein said compound semiconductor substrate comprises a III-V compound semiconductor.

8. The method of claim 7, wherein said compound semiconductor substrate comprises gallium-arsenide-phosphide.

9. The method of claim 1, wherein the hydrofluoric acid used in the removing step is buffered.

10. A method of fabricating an electrical element which includes a doped diffusion region, said method comprising the steps of:

(a) forming a film that is impervious to hydrofluoric acid above a III-V compound semiconductor substrate, the film comprising aluminum nitride;

(b) patterning the film to create a diffusion mask with a window;

(c) forming a diffusion source film comprising a doping agent on the diffusion mask and the window;

(d) diffusing doping agent from the diffusion source film into the III-V compound semiconductor substrate through the window to create the doped diffusion region; and (e) removing the diffusion source film entirely by etching it away with hydrofluoric acid without altering the diffusion mask.

11. The method of claim 10, wherein the film formed in step (a) consists essentially of aluminum nitride.

12. The method of claim 10, further comprising the step of forming an anneal cap on the diffusion source film before step (d) is conducted.

13. The method of claim 12, wherein the anneal cap film comprises a material that is etchable by hydrofluoric acid, and wherein step (e) further comprises etching the anneal cap away with the hydrofluoric acid.

14. The method of claim 12, wherein the material that is etchable by hydrofluoric acid comprises silicon nitride.

15. The method of claim 10, further comprising the step of forming an electrode line on the diffusion mask after step (e) is conducted.

16. The method of claim 10, wherein the III-V compound semiconductor substrate comprises gallium-arsenide-phosphide.

17. The method of claim 16, wherein the doping agent comprises zinc.

18. The method of claim 17, wherein the electrical element is a light-emitting element having a pn junction.

19. A method of fabricating an electrical element which includes a doped diffusion region, said method comprising the steps of:

(a) forming a film consisting essentially of aluminum nitride on a gallium arsenide substrate;

(b) patterning the film to create a diffusion mask with a window;

(c) forming a diffusion source film comprising a doping agent on the diffusion mask and the window;

(d) diffusing doping agent from the diffusion source film into the gallium arsenide substrate through the window to create the doped region;

(e) removing the diffusion source film entirely by etching it away with hydrofluoric acid without altering the diffusion mask; and (f) forming an electrode line on the diffusion mask, the electrode line extending through the window and contacting the doped region.

20. The method of claim 19, further comprising the step of forming an anneal cap on the diffusion layer before step (d) is conducted, and wherein step (e) further comprises etching the anneal cap away with the hydrofluoric acid.

* * * * *